United States Patent [19]

Jones

[11] Patent Number: 5,114,871
[45] Date of Patent: May 19, 1992

[54] MANUFACTURING DIAMOND ELECTRONIC DEVICES

[76] Inventor: Barbara L. Jones, 80 Chisbury Place, Forest Park, Bracknell, RG12 3TX, England

[21] Appl. No.: 356,773

[22] Filed: May 24, 1989

[30] Foreign Application Priority Data

May 24, 1988 [GB] United Kingdom ................ 8812235

[51] Int. Cl.$^5$ ............... H01L 21/283; H01L 21/336
[52] U.S. Cl. ................................. 437/41; 437/229; 437/944; 156/659.1; 148/DIG. 100
[58] Field of Search ............... 437/19, 41, 229, 944; 156/659.1; 148/DIG. 100

[56] References Cited

U.S. PATENT DOCUMENTS

| | | | |
|---|---|---|---|
| 4,174,217 | 11/1979 | Flatley | 437/229 |
| 4,174,219 | 11/1979 | Andres et al. | 156/659.1 |
| 4,223,088 | 9/1980 | Thornburg | 156/659.1 |
| 4,288,282 | 9/1981 | Brown et al. | 156/659.1 |
| 4,328,263 | 5/1982 | Kurahashi et al. | 156/659.1 |
| 4,328,298 | 5/1982 | Nester | 156/659.1 |
| 4,534,103 | 8/1985 | Cho et al. | 437/229 |
| 4,621,042 | 11/1986 | Pampalone et al. | 437/229 |
| 4,637,129 | 1/1987 | Derkits, Jr. et al. | 156/659.1 |
| 4,654,117 | 3/1987 | Aoki et al. | 156/659.1 |
| 4,665,008 | 5/1987 | Nishiura et al. | 156/659.1 |
| 4,670,097 | 6/1987 | Abdalla et al. | 156/659.1 |
| 4,678,542 | 7/1987 | Boer et al. | 156/659.1 |
| 4,767,723 | 8/1988 | Hinsberg, III et al. | 437/229 |
| 4,774,193 | 9/1988 | Juergens | 437/229 |

FOREIGN PATENT DOCUMENTS

| | | | |
|---|---|---|---|
| 0090661 | 10/1983 | European Pat. Off. | |
| 0119669 | 7/1983 | Japan | 437/229 |
| 0135679 | 8/1983 | Japan | 437/229 |
| 0173712 | 9/1985 | Japan | 437/229 |
| 2140929 | 12/1984 | United Kingdom | 437/229 |

OTHER PUBLICATIONS

Ghandhi, VLSI Fabrication Principles, John Wiley and Sons, 1983, pp. 476-477 and 556-560.

*Primary Examiner*—Olik Chaudhuri
*Assistant Examiner*—M. Wilczewski
*Attorney, Agent, or Firm*—Scully, Scott, Murphy & Presser

[57] ABSTRACT

The invention provides a process for manufacturing an electronic device on a semiconducting substrate which is transparent to light of a particular wavelength. The process includes the steps of treating the substrate to form at least one region having a different electrical property to the substrate, and defining a conducting contact for the region by selective photolithographic masking and chemical etching. A layer of photoresist material deposited on one side of the substrate is subjected to light transmitted through the substrate from a light source on the other side of the substrate. The process can be used to produce a field effect transistor on a diamond substrate.

5 Claims, 2 Drawing Sheets

MANUFACTURING DIAMOND ELECTRONIC DEVICES

BACKGROUND OF THE INVENTION

1. Field of the Invention

This invention relates to a method for manufacturing electronic devices and is particularly applicable to the manufacture of a field effect transistor from diamond material, and the transistors formed by the method.

2. Description of the Prior Art.

Field effect transistors (FETs) have been manufactured which comprise a generally conventional FET structure formed on a substrate of diamond, instead of a silicon substrate. The physical properties of diamond result in it having superior characteristics to silicon (Si), gallium arsenide (GaAs) or other known semi-conductive materials in this application. In particular, diamond FETs can be expected to have a lower on resistance, and a higher gain and maximum frequency than transistors employing conventional materials.

Field effect transitors are conventionally formed with the aid of photolithographic masking and chemical etching processes, whereby the source, gate and drain areas of the transistor are demarcated photolithographically, using photo-resist materials, and various mask layers deposited on the substrate of the transistor are selectively removed by etching to define the source, gate and drain regions, as well as metallic contacts for those regions. Due to the small size of the transistor structure, it is difficult to align successive masks during the fabrication process. The tolerances of conventional technology thus set a lower limit on the size of the transistor structure, which thereby places a limit on certain of the transistor operating parameters, such as its high frequency limit.

SUMMARY OF THE INVENTION

According to one aspect of the present invention there is provided a process for manufacturing an electronic device including a photolithographic masking and chemical etching step in which the photoresist material deposited on the substrate is exposed to light transmitted through the substrate prior to chemical etching.

In more detail, according to the invention, a process for manufacturing an electronic device on a semiconducting substrate which is transparent to light of a particular wavelength includes the steps of:

treating the substrate to form at least one region having a different electrical property to the substrate; and defining a conducting contact for the region by selective photolithographic masking and chemical etching, including subjecting a layer of photoresist material deposited on one side of the substrate to light of the particular wavelength transmitted through the substrate from a light source on the other side of the substrate.

In one embodiment according to the invention, a process for manufacturing a field effect transistor includes the steps of:

providing a diamond substrate which is transparent to light of a predetermined wavelength;

defining source, gate and drain regions of the transistor on or in the substrate; and defining contacts for the source, gate and drain regions by selective photolithographic masking and chemical etching, at least one masking and etching step comprising subjecting a layer of photoresist material deposited on one side of the substrate to light of the predetermined wavelength which is passed through the substrate from a light source on the other side of the substrate.

In a further preferred, embodiment, the process includes the steps of:

providing a p-type diamond substrate which is transparent to ultraviolet light;

depositing a layer of insulating material on the surface of the substrate;

depositing a layer of a first metal over the layer of insulating material;

selectively removing the deposited layers to define a gate region of the transistor;

forming source and drain regions of the transistor adjacent to the gate area by ion implantation or chemical etching;

depositing a layer of photoresist material over the source, gate and drain regions;

exposing the layer of photoresist material to ultraviolet light which is passed through the substrate;

removing the exposed photoresist material, so that a layer of photoresist material remains above the gate region;

depositing a layer of a second metal over the source, gate and drain regions; and selectively removing the layer photoresist material and hence the layer of the second metal above the gate region, a MISFET structure thereby being obtained which has source and drain contacts of the second metal and a gate contact of the first metal.

The layer of insulating materials may comprise an oxide, nitride, oxynitride or carbide.

The first metal is preferably a low work function metal such as aluminium or chrome.

The second metal is preferably a high work function metal such as gold, platinum, gold/tantalum alloy, or palladium.

DESCRIPTION OF THE INVENTION

Figure 1A:
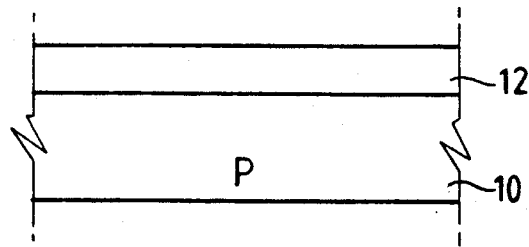
FIGS. 1a to 1h illustrate a process for manufacturing a field effect transistor according to the invention, step by step.

In FIG. 1a, a substrate 10 of p-type diamond material is provided, which is optically transparent. A thin layer 12 of insulating material is deposited on the surface of the substrate 10. The insulating layer 12 comprises an oxide, nitride, oxynitride or carbide material.

Figure 1B:
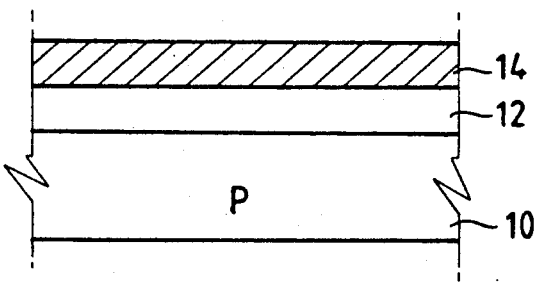

As shown in FIG. 1b, a layer 14 of a first metal is deposited over the layer 12 of insulating material. The first metal is a low work function metal, such as aluminium or chrome.

Figure 1C:
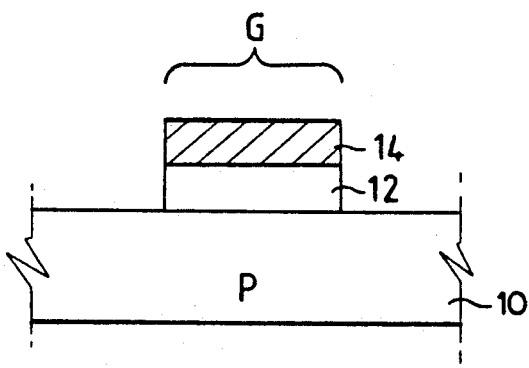

The next step illustrated by FIG. 1c, is to define the gate region of the transistor. This is acheived by a conventional photolithographic masking and chemical etching process, which selectively removes the layers 12 and 14, except in the region of the gate (G).

In the next step of the process, source (S) and drain (D) regions are defined in the upper surface of the substrate 10 by means of ion implantation or by other art known techniques performed on demarcated regions adjacent the gate region. In the case of ion implantation, boron, gallium, carbon or lithium ions can be used. Alternatively, argon etcing can be used. The source and drain regions extend into the surface of the substrate 10 as illustrated schematically in FIG. 1d.

Figure 1D:
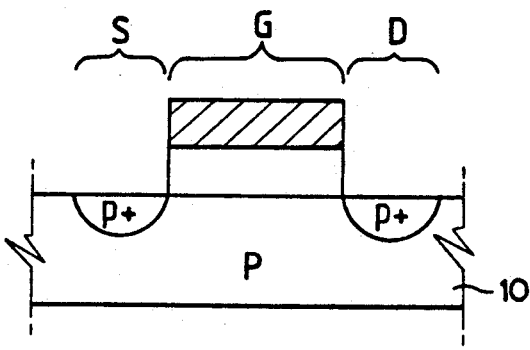
Figure 1E:
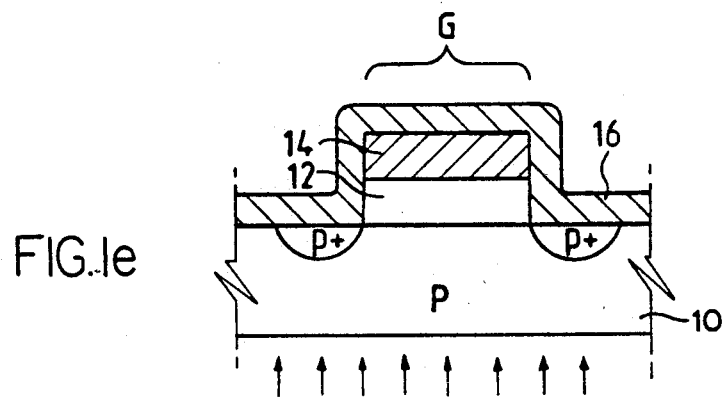

Referring now to FIG. 1e, a layer 16 of positive photo-resist material which is sensitive to ultraviolet (UV) light is deposited over the structure illustrated in FIG. 1d. The structure is then subjected to ultra-violet light from beneath the substrate 10. Because the substrate 10 is transparent to ultra-violet light, the photo-resist layer 16 is exposed to this light, except above the gate region (G), where the metallic layer 14 shields the photo-resist layer from the UV light.

Figure 1F:
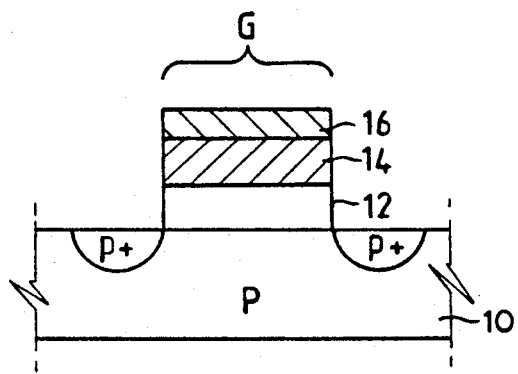

The photo-resist layer 16 is subsequently treated with a solvent, which dissolves the layer 16 in the regions where it was exposed to UV light. Thus, following this step, the photo-resist layer 16 is removed, except from the metal layer 14 above the gate region (G). This is illustrated in FIG. 1f.

Figure 1G:
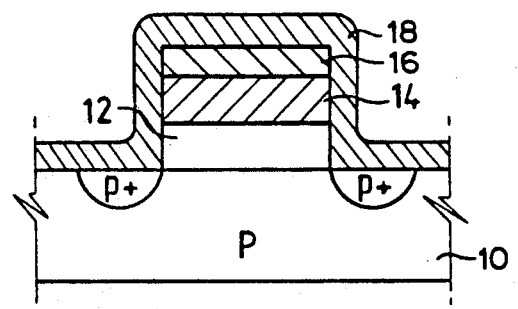

Referring now to FIG. 1g, a layer 18 of a second metal is deposited over the entire structure. The second metal is a high work function metal such as gold, platinum, gold/tantalum alloy or palladium.

Figure 1H:
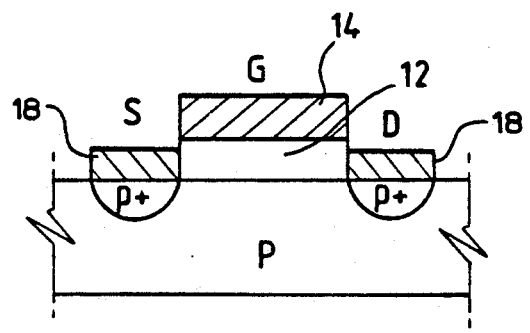

Finally, as shown in FIG. 1h, a lift-off etch technique is used to remove the layer 16 of photo-resist material over the gate region, exposing the metal layer 14. The layer 18 of the second metal is trimmed, by well known photographic techniques removing those portions of the layer which do not lie above the source and drain regions of the transistor. Thus, a MISFET structure is created, with source and drain contacts of the second metal, and a gate contact of the first metal.

Because of the self-aligning effect of exposing the photo-resist layer 16 through the transparent substrate 10, great accuracy is achieved in defining the source, gate and drain contacts relative to one another. In particular, the problem of accurately aligning successive masks during the transistor manufacturing process is avoided.

I claim:

1. A process for manufacturing a unipolar semiconductor device characterized in that it includes the steps of:
   providing a p-type diamond substrate which is transparent to ultraviolet light;
   depositing a layer of insulating material on the surface of the substrate;
   depositing a layer of a first metal over the layer of insulating material;
   selectively removing the deposited layers to define a gate region of the unipolar semiconductor device;
   forming source and drain regions of the unipolar semiconductor device adjacent to the gate area;
   depositing a layer of positive photoresist material over the source, gate and drain regions;
   exposing the layer of photoresist material to ultraviolet light which is passed thorugh the substrate;
   removing the exposed photoresist material, so that a layer of photoresist material remains above the gate region;
   depositing a layer of a second metal over the source, gate and drain regions; and
   selectively removing the layer of photoresist material and hence the layer of the second metal above the gate region, a MISFET structure thereby being obtained which has source and drain contacts of the second metal and a gate contact of the first metal.

2. A process according to claim 1 characterised in that the layer of insulating material comprises an oxide, nitride, oxynitride or carbide.

3. A process according to claim 1 characterised in that the first metal is a low work function metal such as aluminum or chrome.

4. A process according to claim 1 characterised in that the second metal is a high work function metal such as gold, platinum, gold/tantalum alloy, or palladium.

5. A process for manufacturing a unipolar semiconducting device on a semiconducting substrate which is transparent to light of a predetermined wavelength characterized in that it includes the steps of:
   depositing a layer of insulating material on the surface of said semiconducting substrate;
   depositing a metallic layer over the layer of insulating material for forming a conducting gate contact;
   selectively removing the deposited layers to define at least one gate region, each gate region forming a metal insulator semiconductor structure; and
   defining a conducting gate contact for the at least one gate region, and at least one further conducting contact for a region adjacent to the gate region, by selective photolithographic masking and chemical etching, including subjecting a layer of positive photoresist material deposited on the substrate and the meatllic layer to the light of the predetermined wavelength transmitted through the substrate.

* * * * *

UNITED STATES PATENT AND TRADEMARK OFFICE
CERTIFICATE OF CORRECTION

PATENT NO. : 5,114,871

DATED : May 19, 1992

INVENTOR(S) : Barbara L. Jones

It is certified that error appears in the above-identified patent and that said Letters Patent is hereby corrected as shown below:

On the Title page, Section [30], line 2: "8812235" should read as --8812235.3--

Column 1, line 10: "and the" should read as --and to--

Column 3, line 26: "photographic" snould read as --photolithographic--

Column 4, line 46, Claim 5: "to the light" should read as --to light--

Signed and Sealed this

Twenty-eighth Day of September, 1993

Attest:

BRUCE LEHMAN

Attesting Officer

Commissioner of Patents and Trademarks